United States Patent
Wallner et al.

(10) Patent No.: US 7,523,250 B2
(45) Date of Patent: Apr. 21, 2009

(54) SEMICONDUCTOR MEMORY SYSTEM AND SEMICONDUCTOR MEMORY CHIP

(75) Inventors: Paul Wallner, Prien (DE); Andre Schäfer, München (DE); Peter Gregorius, München (DE)

(73) Assignee: Qimonda AG, Munich (DE)

( * ) Notice: Subject to any disclaimer, the term of this patent is extended or adjusted under 35 U.S.C. 154(b) by 227 days.

(21) Appl. No.: 11/509,092

(22) Filed: Aug. 24, 2006

(65) Prior Publication Data
US 2007/0047372 A1 Mar. 1, 2007

(30) Foreign Application Priority Data
Aug. 24, 2005 (DE) .................. 10 2005 040 109

(51) Int. Cl.
*G06F 11/14* (2006.01)
*G06F 13/28* (2006.01)

(52) U.S. Cl. ...................... 711/105; 711/168
(58) Field of Classification Search ............... None
See application file for complete search history.

(56) References Cited

U.S. PATENT DOCUMENTS 6,640,292 B1 * 10/2003 Barth et al. ............ 711/168

2004/0252689 A1 12/2004 Park et al.

OTHER PUBLICATIONS

Rambus Document DL0059, Version 1.11, Preliminary Information; Direct RDRAM™ 128/144-Mbit (256K×16/18×32s).
Rambus Document DL0059, Version 1.11, Preliminary Information; Direct RDRAM™ 128/144-Mbit (256K×16/18×32s); copyright Jun. 2000, Rambus Inc., Mountain View, California.

* cited by examiner

*Primary Examiner*—Hyung S Sough
*Assistant Examiner*—Duc T Doan
(74) *Attorney, Agent, or Firm*—Edell, Shapiro & Finnan, LLC

(57) ABSTRACT

A semiconductor memory system includes a semiconductor memory chip in which data, command, and address signals are transmitted serially between a memory controller and the semiconductor memory chip in signal frames in correspondence with a predetermined protocol. In a receive signal path within the semiconductor memory chip, a frame decoder for decoding the signal frames is arranged following a receiving interface device, and between the frame decoder and a memory core, an intermediate storage device is arranged which has a cell array including a multiplicity of memory cells, and an addressing and selector circuit to which address signals decoded by the frame decoder from command and/or write signal frames supplied by the memory controller are applied, for addressing the cell array and for selecting the write data to be written into the cell array and to be read out of the cell array.

16 Claims, 2 Drawing Sheets

SEMICONDUCTOR MEMORY SYSTEM AND SEMICONDUCTOR MEMORY CHIP

CROSS REFERENCE TO RELATED APPLICATIONS

This application claims priority under 35 U.S.C. §119 to Application No. DE 102005040109.0 filed on Aug. 24, 2005, entitled "Semiconductor Memory System and Semiconductor Memory Chip," the entire contents of which are hereby incorporated by reference.

FIELD OF THE INVENTION

The present invention relates to a semiconductor memory system and to a semiconductor memory chip.

BACKGROUND

In conventional DRAM semiconductor memory systems and memory chips, data, command and address signals to/from a memory controller and/or to/from other semiconductor memory chips are not transmitted in the form of signal frames and not serially, but in parallel. This parallel transmission, for example of write data, commands and addresses, is effected via separate data, command and address signal buses from the memory controller to one or more DRAM memory chips.

In future semiconductor memory systems, e.g., DRAM memory systems and memory chips, the data, command, and address signals will be transmitted with a very high transmission rate as serial signal streams in the form of signal frames corresponding to a predetermined protocol.

In such progressive semiconductor memories, there is, between their memory core and a transmitting/receiving interface device, a frame decoder which is arranged for decoding signal frames received from a receiving interface device and for the further transmission of data and commands to the memory core. Since write data units belonging to one another can be contained not only in a single signal frame but also in a number of successively transmitted signal frames depending on the protocol, which also applies to command units belonging to one another such a semiconductor memory chip must have a temporary storage device, which is connected to the frame decoder and the memory core and which is arranged for temporarily storing a number of data and/or command units decoded by the frame decoder, and which provides the flexibility, which is absolutely necessary, in the transfer process of the write data units and/or command units to the memory core in such a progressive semiconductor memory chip.

SUMMARY

As described herein, a semiconductor memory system and a semiconductor memory chip achieve a temporary storage of a number of write data and/or command units, decoded by the frame decoder, clock-synchronously with the frame decoder and thus a storage of data and/or command units which is not critical with respect to time and a reading-out of these into the memory core which is not critical with respect to time.

Data, command, and address signals are transmitted serially between a memory controller and the semiconductor memory chip in signal frames in correspondence with a predetermined protocol. In a receive signal path within the semiconductor memory chip, a frame decoder for decoding the signal frames is arranged following a receiving interface device, and between the frame decoder and a memory core, an intermediate storage device is arranged which has a cell array including a multiplicity of memory cells, and an addressing and selector circuit to which address signals decoded by the frame decoder from command and/or write signal frames supplied by the memory controller are applied, for addressing the cell array and for selecting the write data to be written into the cell array and to be read out of the cell array.

BRIEF DESCRIPTION OF THE DRAWINGS

Exemplary embodiments of the invention will be described in connection with the following drawing figures in which like reference numerals in the various figures are utilized to designate like components.

DETAILED DESCRIPTION

Figure 1:
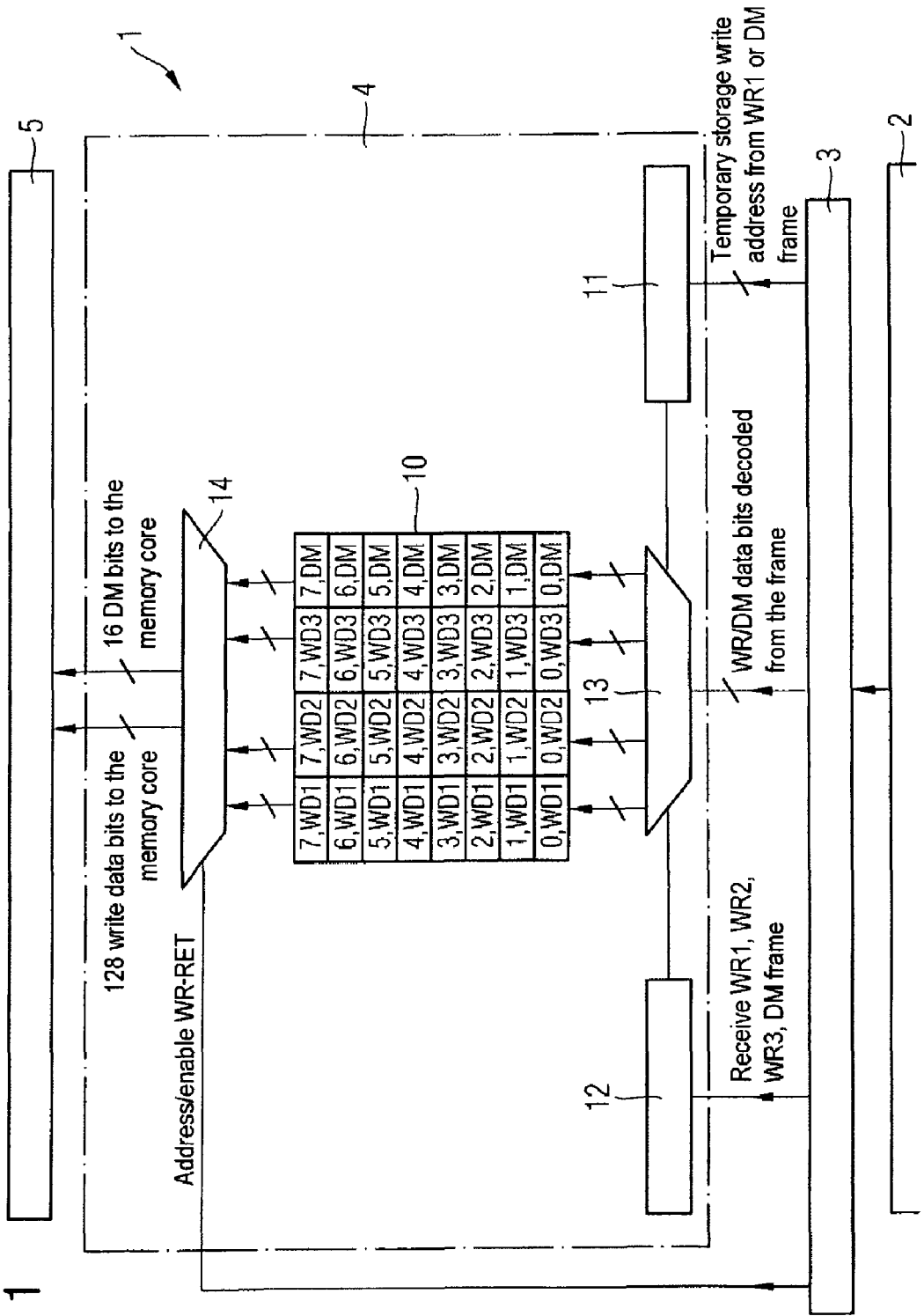
FIG. 1 diagrammatically shows a functional block diagram of a variant of an embodiment of a semiconductor memory chip according to an exemplary embodiment of the invention.

A semiconductor memory system includes a memory controller and at least one semiconductor memory chip connected to the memory controller via data, command, and address bus lines, which has a memory core and a transmitting and receiving interface device in each case for transmitting and receiving data, command and address signals to/from the memory controller and/or to/from a further similar semiconductor memory chip, wherein the semiconductor memory system is arranged for transmitting the data, command and address signals as serial signal streams in the form of signal frames in correspondence with a predetermined protocol.

The semiconductor memory chip also includes the following: a frame decoder arranged between the receiving interface device and the memory, which is adapted for decoding signal frames received by the receiving interface device, and a temporary storage device arranged for temporarily storing a number of write data and/or command units decoded by the frame decoder, which is arranged on the receiving path between the frame decoder and the memory core and which has a cell array which comprises a plurality of memory addresses and an addressing and selector circuit, to which address signals decoded by signal frames supplied by the memory controller from the frame decoder are applied, for addressing the cell array and for read/write selection out of/into the cell array. The addressing and selector circuit may include an address pointer and a frame counter.

Further, a semiconductor memory chip includes a memory core and a transmitting and receiving interface device for transmitting and receiving data, command and address signals to a memory controller and/or to/from a further similar semiconductor memory chip via data, command, and address bus lines. The semiconductor memory chip transmits the data, command, and address signals as serial signal streams in the form of signal frames in correspondence with a predetermined protocol, and also includes: a frame decoder arranged between the receiving interface device and the memory, which is adapted for decoding signal frames received by the receiving interface device, and a temporary storage device arranged for temporarily storing a number of write data and/ or command units decoded by the frame decoder, which is arranged on the receiving path between the frame decoder and the memory core and which has a cell array which comprises a plurality of memory addresses and an addressing and selector circuit, to which address signals decoded by signal frames supplied by the memory controller from the frame decoder are applied, for addressing the cell array and for read/write selection out of the/into the cell array. In this arrangement, the addressing and selector circuit may include an address pointer and a frame counter.

The temporary storage device and its addressing and selector circuit preferably operate clock-synchronously with the frame decoder in the semiconductor memory system and chip.

Furthermore, each addressable memory cell of the cell array of the temporary storage device is preferably subdivided into a number of separate sections for successive or interrupted multiple accesses for cases where commands and/or write data are delivered in a number of clock cycles in the semiconductor memory system and chip.

In one embodiment, the addressing and selector circuit of the temporary storage device also includes a temporary storage write selector, which is driven by write selection control signals formed from output signals of the address pointer and of the frame counter, at the input of the cell array and, at its output preceding the memory core, a temporary storage read selector which is driven by read selection control signals decoded by the frame decoder from a read command frame.

As mentioned, the temporary storage device and its addressing and selector circuit can be arranged for the temporary storage both of a number of write data units and of a number of command units.

In a variant of an embodiment, however, the temporary storage device and its addressing and selector circuit can be arranged only for the temporary storage of write data.

If the predetermined protocol in the semiconductor memory system is also set up for transmitting write data masking bits in temporal proximity and respective data allocation to a respective write data unit within a command/write data signal stream, the temporary storage device and its addressing and selector circuit can be arranged in this case, apart from the temporary storage of a number of write data units, also for the temporary storage of their associated masking bits in each case in separate sections of each addressable memory cell of the cell array.

The temporary storage device proposed here and its addressing and selector circuit, due to being divided into a number of separate sections for successive or interrupted multiple accesses in cases where commands and/or write data are delivered in a number of clock cycles, for each addressable memory cell, brings the advantage of reduced logic complexity and a saving in area in the semiconductor memory chip. In addition, the proposal made here to use such a temporary storage device together with its addressing and selector circuit between the frame decoder and the memory core brings the advantage of increased flexibility in the transmission of write data and/or commands from the frame decoder to the memory. Since in the embodiment proposed here, the address signals for addressing the cell array, provided to the addressing and selector circuit of the temporary storage device and decoded by the frame decoder, come from a signal frame delivered by a memory controller, i.e., the memory controller finally determines the address for the temporary storage device, the complexity of logic for generating addresses in the temporary storage device is reduced and is much less time consuming in comparison with any possible other solution which generates the address in the temporary storage device itself.

Exemplary embodiments are described below in conjunction with the drawings. While these descriptions go into specific details, it should be understood that variations may and do exist and would be apparent to those skilled in the art based on the descriptions herein.

FIG. 1 shows diagrammatically a section of the receiving path of a semiconductor memory chip 1 between a receiving interface device 2, only indicated, and a memory core 5, also only indicated. The receiving interface device 2 of the semiconductor memory chip 1 is directly followed by the frame decoder 3, which has the task of decoding the signal frames, supplied by the receiving interface device 2, with regard to write, read, system, and other commands, and write and read data and masking bits, and also of converting the decoded data into parallel form. A temporary storage device 4 which is arranged for temporarily storing a number of write data and write data masking bits decoded by the frame decoder 3 is located on the receiving path between the frame decoder 3 and the memory core 5 and has a cell array 10, comprising a plurality of addressable memory cells, and an addressing and selector circuit, to which address signals, decoded by the frame decoder 3 from signal frames supplied by a memory controller (not shown) are applied, which has an address pointer 11, a write selector 13, and a read selector 14 for addressing and for selecting the write data and masking bits to be written into the cell array 10 and to be read out of it. The write selector 13 is arranged at the input of the cell array 10 and is driven by output signals of the address pointer 11 and of the frame counter 12 for writing write data and masking bits into the cell array 10. The read selector 14 is arranged at the output of the cell array 10 and is driven by a read selection control signal "address/enable WR-RET" decoded by the frame decoder from a read command frame.

It must be noted that in this embodiment, the temporary storage device is arranged only for temporarily storing write data units WD1, WD2, WD3 and masking bits DM allocated to these.

It shall be assumed that, due to the predetermined protocol, write data units are distributed over a number of write signal frames not necessarily following one another. The frame decoder 3 decodes from incoming signal frames WR1, WR2, WR3, DM, a control signal "receive frame" which is supplied to the frame counter 12 in the temporary storage device 4 for counting the frames. Furthermore, the frame decoder 3 decodes the write data units and the masking bits received in the frames, which are supplied to the write selector 13 by the frame decoder 3. In the exemplary embodiment, the frame decoder 3 decodes from the frame WR1 or the DM frame, the temporary storage write address which is supplied to the address pointer 11. The write selector 13, in turn, is driven by output signals from the address pointer 11 and from the frame counter 12 for selectively writing the respective write data units WD1, WD2, and WD3 and the write data masking bits. The address for the temporary storage device 4 does not need to be transmitted within the signal frames WR2, WR3, and DM if the address has been transmitted by the memory controller in signal frame WR1.

The starting point for a more precise specification is where the write address is deposited: 1. If an address is fully described before the next one starts, then the address must be appropriately delivered with the first frame or possibly even with the last frame of the preceding write cycle of another address. 2. If different addresses are described overlapping, the address information may have to be supplied with each one of the frames.

In addition, the frame decoder 3 decodes from a signal frame "WR-RET" the command from the temporary storage device 4 to read write data units and masking bits out of the cell array 10 and to supply these to the memory core 5. For this purpose, the temporary storage read selector 14 arranged at the output of the cell array 10 receives from the frame decoder 3 the read address, decoded from the signal frame WR-RET, for reading out of the cell array 10, and an enable signal.

The cell array 10 itself is subdivided into a number of sections corresponding to the number of the write data frames WR1, WR2, WR3 and of the masking bit frames, for each addressable memory cell. The cell array 10 is always accessed in the following sequence: WR1-WR2-WR3-DM. Signal frames can be interrupted by blank frames or by a read request to different addresses.

Read and write accesses to the temporary storage device 4 can be executed either by a bidirectional bus system or by two unidirectional buses. In the embodiment shown in FIG. 1 and described here, two unidirectional buses are implemented in each case from the frame decoder 3 to the temporary storage device 4 and from the temporary storage device 4 to the memory core 5.

Figure 2:
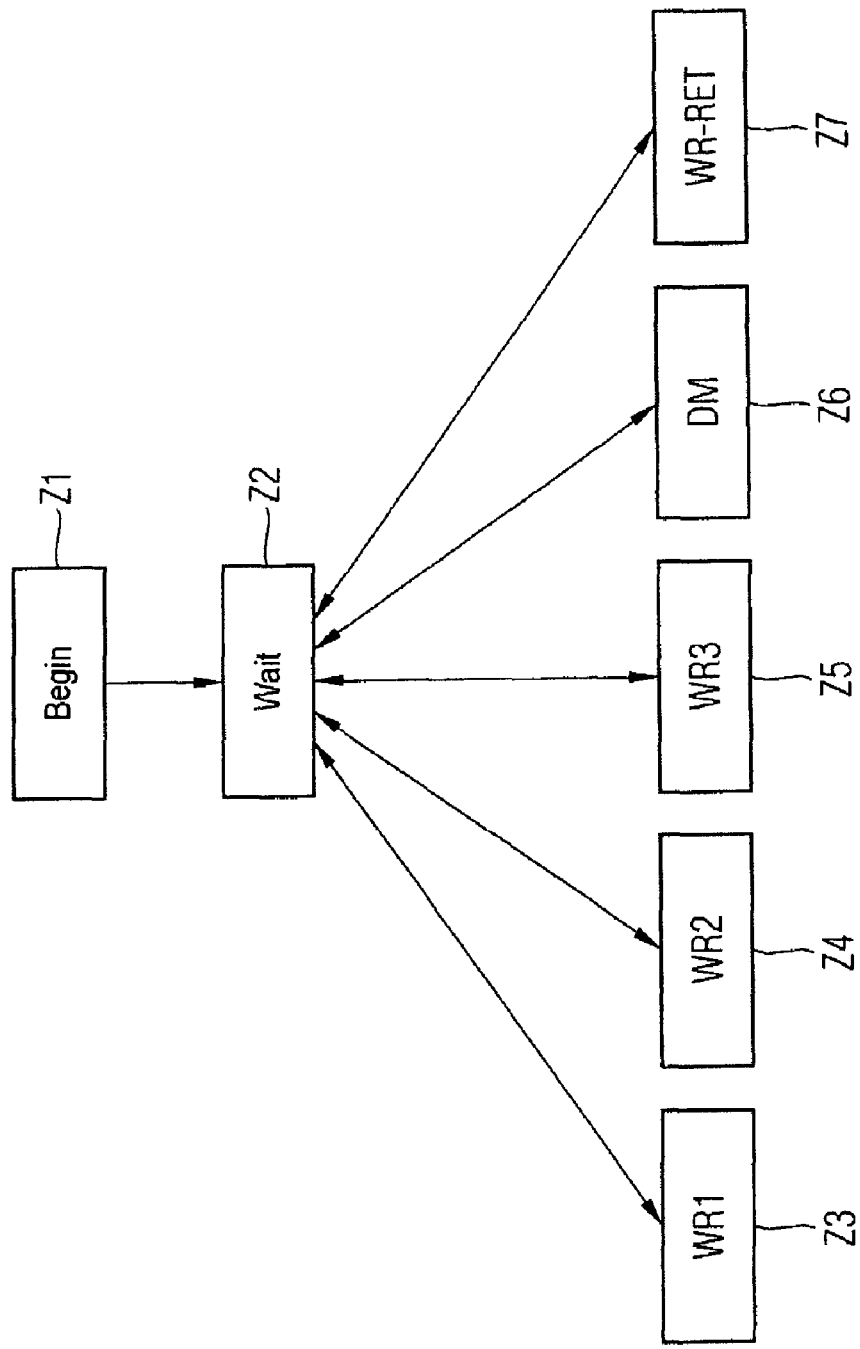
FIG. 2 graphically shows a state diagram applicable to the temporary storage device according to an exemplary embodiment of the invention.

FIG. 2 illustrates a state diagram, having seven states Z1-Z7, for the temporary storage device 4, illustrated in FIG. 1, in the semiconductor memory chip. In the text which follows, the operation of the temporary storage device 4 is explained in conjunction with the frame decoder 3 and the memory core 5 with reference to FIGS. 1 and 2.

Z1: at the beginning, the entries of the cell array 10 and also the address pointer 11 and the frame counter 12 in the temporary storage device 4 are set to zero. The temporary storage write selector 13 and the temporary storage read selector 14 are secured or blocked, respectively.

Z2: wait state until the next activity of the temporary storage device 4, i.e., initiating a writing-in of write data and masking bits into the former or reading out write data or masking bits by WR-RET.

Z3: following the decoding of a WR1 signal frame, the frame decoder 3 simultaneously decodes the address of the cell array 10 from the frame bits and correspondingly sets the address pointer 11. The frame counter 12 is set to zero. With the next clock cycle, the write data (WD1) can be written into the corresponding address of the cell array 10 via the temporary storage write selector 13. If the DM signal frames are only an option, the DM section at the corresponding address of the cell array 10 is set to zero.

Z4: During access to a WR2 signal frame, the address of the cell array 10 is already available from the decoding of the WR1 signal frame and the frame counter 12 is therefore only incremented by one. With the next clock cycle, the write data (WD2) are written into the second section of the corresponding address (e.g., zero) of the cell array 10 via the temporary storage write selector 13.

Z5: During access to a WR3 signal frame, the address of the cell array 10 is already available from the decoding of the WR1 signal frame and the frame counter 12 is therefore only incremented by one. With the next clock cycle, the write data (WD3) are written into the cell array 10 via the temporary storage write selector 13 and in the third section at the corresponding address (e.g., zero).

Z6: During access to a DM signal frame, the address of the cell array 10 is already available from the decoding of the WR1 signal frame and the frame counter 12 is therefore only incremented by one. With the next clock cycle, the data masking bits (DM) are written into the cell array 10 via the temporary storage write selector 13 into the DM section at the corresponding address (e.g., zero). If no DM signal frame occurs, it does not matter since the DM section has previously been set to zero in any case.

Z7: A read command from the temporary storage device 4 or its cell array 10, respectively, can arrive with each frame. Simultaneous reading out of the cell array 10 is possible even during write data sequences (which are interrupted by such a read signal frame) as long as the read request is directed to another address of the cell array 10. Should such a read request occur, the applicable address of the cell array 10 is decoded from the read signal frame and with the next clock cycles, the write data WD1, WD2, WD3 and possibly the write data masking bits DM are read out at the previously decoded address of the cell array 10 via the temporary storage read selector 14, now enabled, and transferred to the memory core 5. In the example shown in FIG. 1, it is assumed that 128 write data bits and 16 data masking (DM) bits are read out of the cell array 10 via the temporary storage read selector 14 to the memory core 5 by such a read command WR-RET.

Since, in the solution described above, the read and write addresses for the cell array 10 of the temporary storage device 4 are in each case also supplied by the memory controller in a read signal frame and a write signal frame (WR-RET), the temporary storage device 4 shown in FIGS. 1 and 2 and described above, of the semiconductor memory chip according to the invention, has the following advantages in comparison with another type of solution in which the read and write address for the cell array would be calculated in each case within the temporary storage device:

saving of function blocks for address calculation for the subsequent write data signal frames and of function blocks for the recalculation of the address of the cell array 10 for the write data signal frames following a read request WR-RET from the cell array 10;

saving of area in the semiconductor memory chip due to the saving of additional function blocks;

identical duration for all address determinations for the cell array; and avoiding time overlaps for the frame sequence: "WR-RET"→"WRD1".

The preferred solution, described above and shown in FIGS. 1 and 2, for addressing for writing write data and data masking bits into the cell array 10 and for addressing for reading write data and data masking bits out of the latter thus avoids additional functional complexity and additional hardware expenditure in the semiconductor memory chip especially since the address information for addressing the cell array 10 already exists in the memory controller, in any case, and since free positions are available for transmitting this address in the WR1 data signal frame.

It must be mentioned that, although the above description and FIGS. 1 and 2 describe and show a temporary storage device 4 which is arranged only for temporarily storing write data units WD1-WD3 and their associated masking bits DM in separate sections of each addressable memory cell of the cell array 10, the basic principle of the invention is similarly applicable to a temporary storage device in which, in addition to the write data units and the masking bits, command units decoded from corresponding command signal frames are also temporarily stored and also to a temporary storage device in which, instead of the write data units and the masking bits, only command units decoded from the command signal frames are temporarily stored.

The above description describes a semiconductor memory chip according to the invention which has a memory core and a transmitting and receiving interface device in each case for transmitting and receiving data, command and address signals to a memory controller and/or to/from a further similar semiconductor memory chip in each case via data, command and address bus lines, wherein the semiconductor memory chip and the memory controller are arranged for transmitting the data, command and address signals as serial signal streams in the form of signal frames in correspondence with a predetermined protocol, and the semiconductor memory chip also has the following:

a frame decoder arranged between the receiving interface device and the memory, which is adapted for decoding signal frames received by the receiving interface device, and a temporary storage device arranged for temporarily storing a number of write data and/or command units decoded by the frame decoder, which is arranged on the receiving path between the frame decoder and the memory core and which has a cell array which comprises a multiplicity of memory addresses and an addressing and selector circuit, to which address signals decoded by signal frames supplied by the memory controller from the frame decoder are applied, for addressing the cell array and for read/write selection out of the/into the cell array. In this case, the addressing and selector circuit has an address pointer and a frame counter.

It is immediately clear to the expert that the features described and shown are also applicable to a semiconductor memory system, according to the invention, with a memory controller and at least one semiconductor memory chip connected to the memory controller via data, command and address bus lines, which has a memory core and a transmitting and receiving interface device, in each case for transmitting and receiving data, command and address signals to/from the memory controller and/or to/from a further similar semiconductor memory chip, wherein the semiconductor memory system is arranged for transmitting the data, command and address signals as serial signal streams in the form of signal frames in correspondence with a predetermined protocol, and the at least one semiconductor memory chip has the following:

a frame decoder arranged between the receiving interface device and the memory, which is adapted for decoding signal frames received by the receiving interface device, and a temporary storage device arranged for temporarily storing a number of write data and/or command units decoded by the frame decoder, which is arranged on the receiving path between the frame decoder and the memory core and which has a cell array which comprises a multiplicity of memory addresses and an addressing and selector circuit, to which address signals decoded by signal frames supplied by the memory controller from the frame decoder are applied, for addressing the cell array and for data selection out of the/into the cell array.

It is believed that other modifications, variations and changes will be suggested to those skilled in the art in view of the teachings set forth herein. It is therefore to be understood that all such variations, modifications and changes are believed to fall within the scope of the present invention as defined by the appended claims. Although specific terms are employed herein, they are used in a generic and descriptive sense only and not for purposes of limitation.

LIST OF REFERENCE SIGNS

1 Semiconductor memory chip
2 Receiving interface device
3 Frame decoder
4 Temporary storage device
5 Memory core
10 Cell array of the temporary storage device 4
11 Address pointer
12 Frame counter
13 Temporary storage write selector
14 Temporary storage read selector
WD1, WD2, WD3 Write data units
DM Data masking bits and signal frame
WR1, WR2, WR3 Write signal frames
WR-RET Read request from the temporary storage device
Z1-Z7 States

What is claimed is:

1. A system, comprising:
   a memory controller; and
   at least one memory device connected to the memory controller via data, command, and address bus lines, wherein the at least one memory device comprises:
   a memory core;
   a transmitting and receiving interface that transmits and receives data, command, and address signals to/from the memory controller and/or to/from another memory device, wherein the system is operable to transmit the data, command, and address signals as serial signal streams in the form of signal frames in correspondence with a predetermined protocol;
   a frame decoder in a path between the transmitting and receiving interface and the memory core, that decodes signal frames received by the transmitting and receiving interface; and
   a temporary storage circuit that temporarily stores a number of write data and/or command units decoded by the frame decoder, the temporary storage circuit being in the receiving path between the frame decoder and the memory core and including: a cell array comprising a plurality of memory addresses; and an addressing and selector circuit to which address signals decoded by the frame decoder from signal frames supplied by the memory controller are applied, that addresses the cell array and that performs read/write selection out of/into the cell array, wherein the addressing and selector circuit includes an address pointer and a frame counter.

2. The system as claimed in claim 1, wherein the addressing and selector circuit further includes:
   a temporary storage write selector in a path between the frame decoder and an input of the cell array, and driven by write selection control signals formed from output signals of the address pointer and of the frame counter; and
   a temporary storage read selector in a path between an output of the cell array and the memory core, and driven by read selection control signals decoded by the frame decoder from a read command frame.

3. The system as claimed in claim 1, wherein the temporary storage circuit and its addressing and selector circuit operate clock-synchronously with the frame decoder.

4. The system as claimed in claim 1, wherein the cell array is subdivided into a number of separate sections for successive or interrupted multiple accesses in cases where commands and/or write data are supplied in a number of clock cycles, for each addressable memory cell.

5. The system as claimed in claim 1, wherein the temporary storage circuit, the cell array, and the addressing and selector circuit are operable only for temporarily storing write data units.

6. The system as claimed in claim 1, wherein the predetermined protocol and the system are operable to transmit write data masking bits in temporal proximity and in respective data allocation to a respective write data unit within a command/write data signal stream, and the temporary storage circuit and the addressing and selector circuit are operable only for temporarily storing write data units and their associated masking bits in separate sections of each addressable memory cell of the cell array.

7. A memory device, comprising:
a memory core;
a transmitting and receiving interface that transmits and receives data, command, and address signals to a memory controller and/or to/from another memory device via data, command, and address lines, wherein the memory device is configured to receive the data, command, and address signals as serial signal streams in the form of signal frames in correspondence with a predetermined protocol;
a frame decoder in a path between the transmitting and receiving interface and the memory core, that decodes signal frames received by the transmitting and receiving interface; and
a temporary storage circuit in the receiving path between the frame decoder and the memory core, that temporarily stores a number of write data and/or command units decoded by the frame decoder, the temporary storage circuit comprising:
a plurality of memory addresses; and
an addressing and selector circuit to which address signals decoded by signal frames supplied by the memory controller from the frame decoder are applied, that addresses the cell array and that performs data selection out of/into the cell array, wherein the addressing and selector circuit includes an address pointer and a frame counter.

8. The memory device as claimed in claim 7, wherein the addressing and selector circuit further includes:
a temporary storage write selector in a path between the frame decoder and an input of the cell array, and driven by write selection control signals formed from output signals of the address pointer and of the frame counter; and
a temporary storage read selector in a path between an output of the cell array and the memory core, and driven by read selection control signals decoded by the frame decoder from a read command frame.

9. The memory device as claimed in claim 7, wherein the temporary storage circuit and the addressing and selector circuit operate clock-synchronously with the frame decoder.

10. The memory device as claimed in claim 7, wherein the cell array is subdivided into a number of separate sections for successive or interrupted multiple accesses in cases where commands and/or write data are supplied in a number of clock cycles, for each addressable memory cell.

11. The memory device as claimed in claim 7, wherein the temporary storage circuit, the cell array, and the addressing and selector circuit are operable only for temporarily storing write data units.

12. The memory device as claimed in claim 7, wherein the predetermined protocol and the memory device are operable to transmit write data masking bits in temporal proximity and in respective data allocation to a respective write data unit within a command/write data signal stream, and the temporary storage circuit and the addressing and selector circuit are operable only for temporarily storing write data units and their associated masking bits in separate sections of each addressable memory cell of the cell array.

13. A method of operating a memory device, comprising:
supplying at least one of data, command, and address signals to the memory device as a serial signal stream in the form of signal frames according to a protocol;
decoding signal frames received by the memory device, including decoding from frame bits an address of a cell array of a temporary storage circuit;
temporarily storing signals from the signal frame in the cell array in accordance with the address, wherein the address within the cell array is indicated by a frame counter and an address pointer; and
transferring the signals from the cell array of the temporary storage circuit to a memory core of the memory device.

14. The method of claim 13, wherein writing signals into one portion of the cell array and transferring signals out of another portion of the cell array occur simultaneously.

15. The method of claim 13, wherein a sequence of frames is stored in the cell array using an address from a single frame and by incrementing a frame counter.

16. The method of claim 13, wherein the temporary storage circuit operates clock-synchronously with a frame decoder for decoding the serial signal stream.

* * * * *